United States Patent [19]

Miller

[11] Patent Number: 5,191,400
[45] Date of Patent: Mar. 2, 1993

[54] LINEAR ACOUSTIC CHARGE TRANSPORT CIRCUIT

[75] Inventor: Robert L. Miller, Bowie, Md.
[73] Assignee: Westinghouse Electric Corp., Pittsburgh, Pa.
[21] Appl. No.: 747,819
[22] Filed: Aug. 21, 1991
[51] Int. Cl.$^5$ .................. H01L 29/84; H01L 29/96
[52] U.S. Cl. ................... 377/60; 257/183.1; 257/245; 257/416
[58] Field of Search .............. 357/24, 26, 16, 22 A; 330/253; 377/60; 365/183

[56] References Cited

U.S. PATENT DOCUMENTS

| | | | |
|---|---|---|---|
| 3,663,888 | 5/1972 | Greene | 330/253 |
| 4,371,953 | 2/1983 | Hyatt | 365/45 |
| 4,518,870 | 5/1985 | Banu | 338/253 |
| 4,633,285 | 12/1986 | Hunsinger et al. | 357/24 |
| 4,862,110 | 8/1989 | Charbonnier | 333/155 |
| 5,073,807 | 12/1991 | Fliegel et al. | 357/24 |

OTHER PUBLICATIONS

William J. Tanski et al., *Heterojunction Acoustic Charge Transport Devices on GaAs*, 1987 American Institute of Physics, Jan. 4, 1988, pp. 18–20.
G. A. Peterson, et al., *Charge Confinement in Heterojunction Acoustic Charge Transport Devices*, 1989 American Institute of Physics, Sep. 25, 1989, pp. 1330–1332.

*Primary Examiner*—Andrew J. James
*Assistant Examiner*—Sara W. Crane
*Attorney, Agent, or Firm*—D. G. Maire

[57] ABSTRACT

A linear acoustic charge transport circuit including an acoustic charge transport (ACT) device and a transconductance amplifier. In one embodiment the ACT device includes a bipolar injector. The ACT device can comprise either a thick channel ACT or a heterojunction ACT.

7 Claims, 7 Drawing Sheets

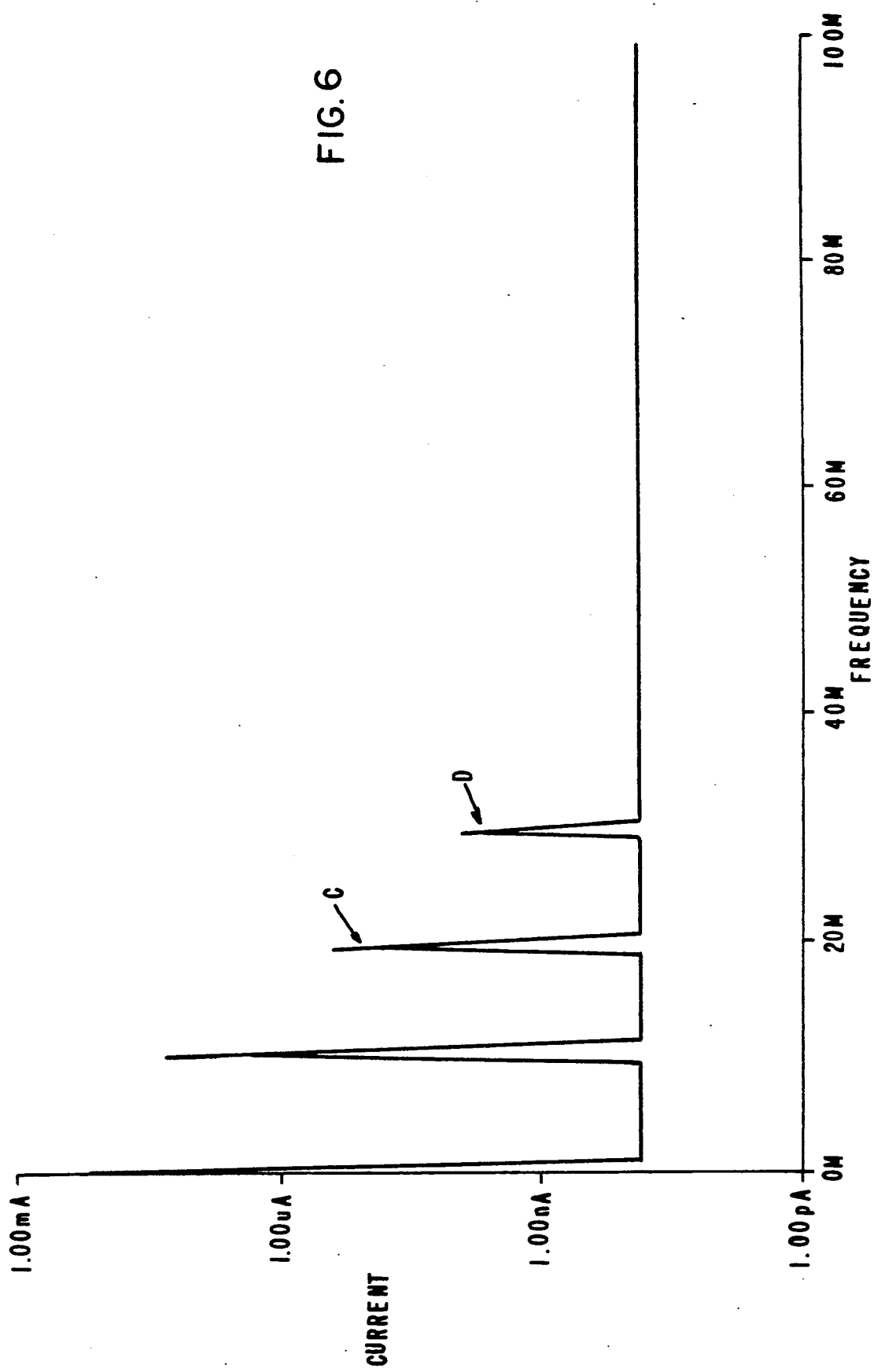

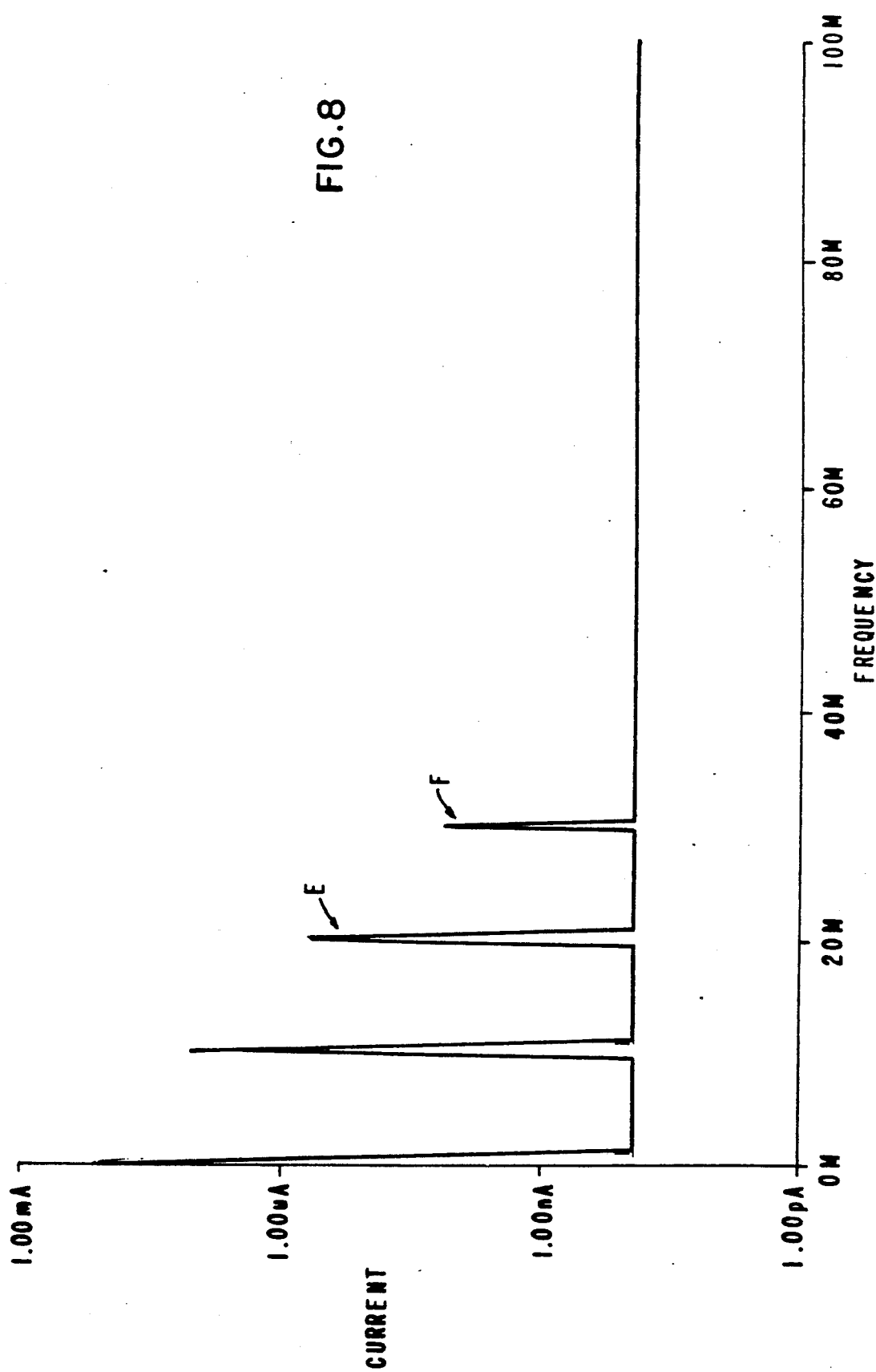

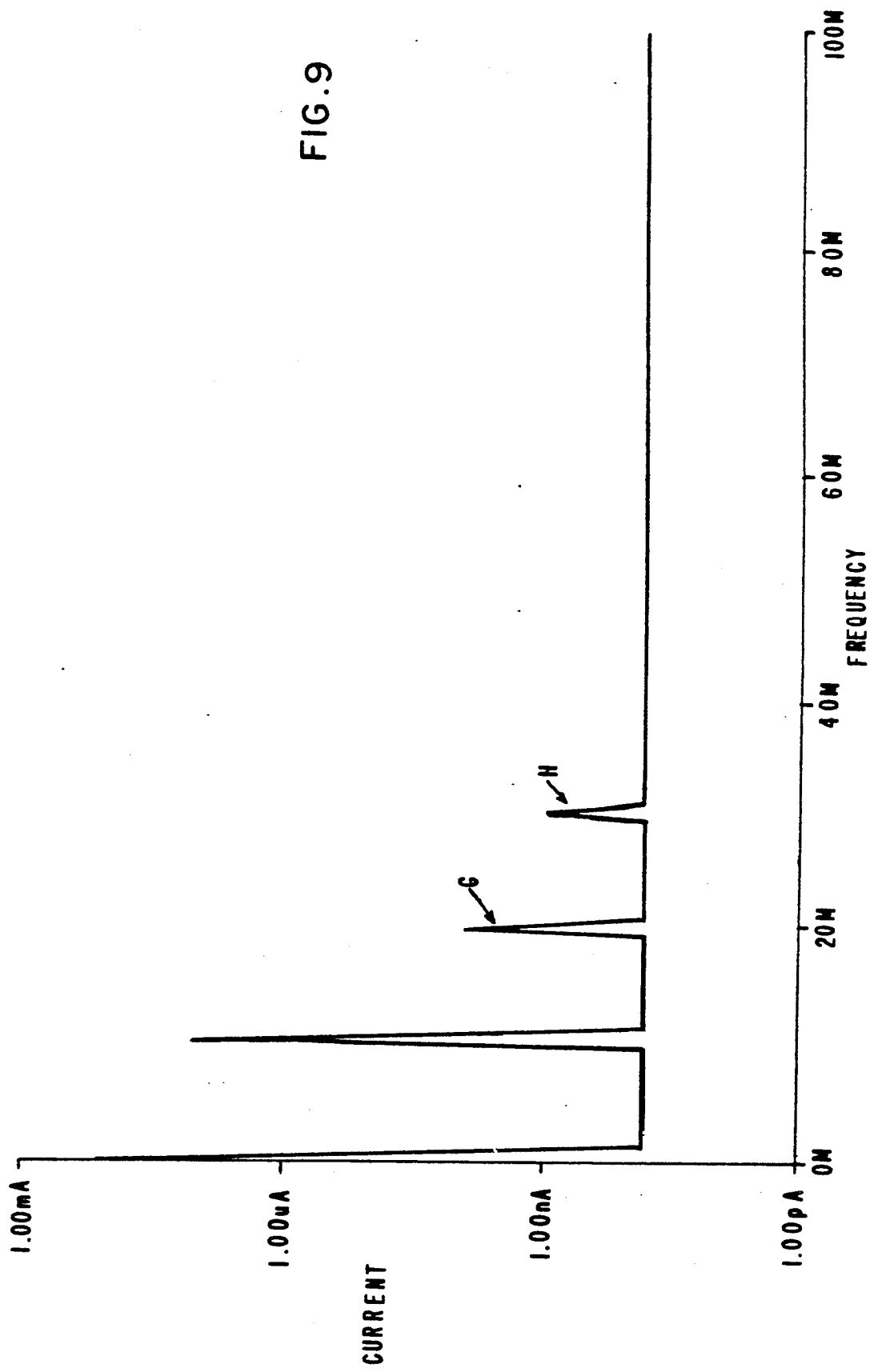

LINEAR ACOUSTIC CHARGE TRANSPORT CIRCUIT

BACKGROUND OF THE INVENTION

The present invention relates to linear circuits; and in particular, to a linear acoustic charge transport (ACT) circuit. Generally, ACT devices have an inherent non-linear input characteristic. At high frequencies (e.g., more than a few MHz), this non-linearity causes unwanted frequency distortion that limits the dynamic range of an ACT device. FIG. 1 illustrates a typical input curve for an ACT device employing standard ohmic injection. As seen from FIG. 1, there is a non-linear relationship between the current injected into the channel of an ACT device and the voltage applied to the input of the device. These non-linearities cause second order and third order intermodulation products at the ACT device output. In many applications, these intermodulation products can cause spurious in-band signals.

There are two contributions to the input non-linearity of an ACT device. The first is termed Q-V non-linearity. This non-linearity arises from the amount of current injected into an ACT device for a given input voltage as noted above. The second contribution to the non-linear input characteristic is termed timing non-linearity. This contribution results from a variable charge injection location within the ACT channel. That is, the location of a charge packet at the instant it is created varies in dependence upon the amount of voltage applied to the input of an ACT device. Of the two contributions to the input non-linearity, the Q-V non-linearity factor dominates at lower frequencies, below 1/6 the surface acoustic wave (SAW) frequency of the ACT. The timing non-linearity dominates at higher frequencies, above 1/6 the SAW frequency of the ACT.

FIG. 2 illustrates the calculated frequency spectrum at the output of an ACT device driven by a voltage source. The data shown in FIG. 2 represents the response of an ACT device driven with a 10 MHz voltage source having a 50 $\mu$A DC output and a 10 $\mu$A AC output. As seen at points A and B of FIG. 2, the second and third order harmonics are quite large compared to the fundamental frequency. Thus, conventional ACT circuits have unwanted harmonics that adversely affect the system using an ACT device.

SUMMARY OF THE INVENTION

It is an object of the present invention to provide an ACT circuit having improved frequency response.

It is another object of the present invention to provide an ACT circuit having a linear input.

It is another object of the present invention to provide an ACT circuit having a low input impedance.

To achieve to the above and other objects, the present invention provides an acoustic charge transport circuit comprising an ACT device, and an R.F. transconductance amplifier operatively connected to the ACT device.

BRIEF DESCRIPTION OF THE DRAWINGS

FIG. 6 is a graph showing the calculated frequency spectrum at the output of the linear ACT circuit of FIG. 3.

FIG. 8 is a graph showing the calculated frequency spectrum at the output of a heterojunction ACT driven by a voltage source; and FIG. 9 is a graph showing the calculated frequency spectrum at the output of the linear heterojunction ACT circuit of FIG. 7.

DESCRIPTION OF THE PREFERRED EMBODIMENT

Figure 1:
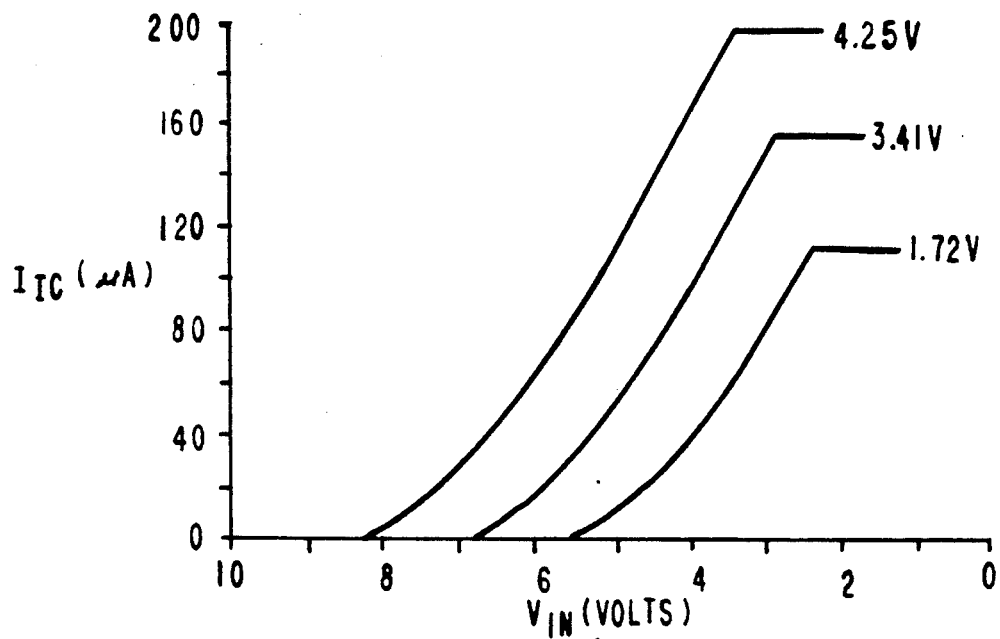
FIG. 1 is a graph showing the non-linearities of an ACT device.
Figure 3:
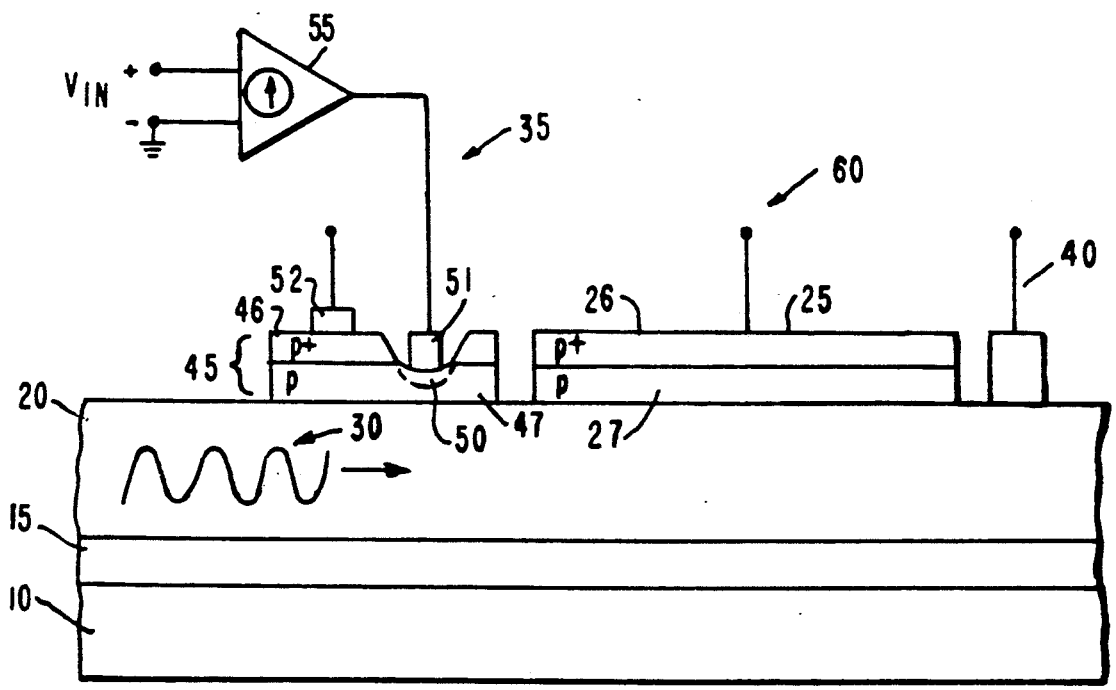
FIG. 3 is a cross-sectional view of an ACT device in the linear ACT circuit of the present invention.

FIG. 3 is a cross-sectional view of an ACT device in the linear ACT circuit of the present invention. In FIG. 3, reference numeral 10 identifies a GaAs substrate having a p+ GaAs layer 15 formed thereon. Inclusion of layer 15 in the FIG. 3 ACT circuit is optional. Layer 15 enables the formation of the depletion layer within the channel layer 20 by back-biasing the PN junction between layers 15 and 20. However, in structures having a layer such as the layer 15, there are typically feed-through problems caused by the introduction of another current path existing in parallel with the channel layer 20. As shown in FIG. 3, an n-type channel layer 20 is formed over the substrate 10 and on the p+ GaAs layer 15. The channel layer 20 has an impurity concentration in the range of, for example, $1 \times 10^{15}/cm^8$ to $4 \times 10^{15}/cm$. Surface acoustic waves (SAWs) 30 travel within the channel layer 20. The SAWs are launched into the channel layer 20 by transducers not shown.

A p-type GaAs channel plate electrode 25 is positioned on the channel layer 30. The channel plate electrode 25 comprises a p+ portion 26 and a p portion 27. The p+ portion is doped to concentration of, for example, $2 \times 10^{18}/cm^3$, and has a thickness of, for example, 1,000 Å. The p portion is doped to concentration of, for example, $5 \times 10^{16}/cm^3$, and has a thickness of approximately 2,500 Å. As is known to those skilled in the art, the plan view layout of the channel plate electrode 25 can have a variety of shapes. These shapes are selected in accordance with the desired sensing of charges travelling within the channel layer 20. In addition, the channel plate electrode 25 can be a light sensitive material which allows the entire top surface of the channel layer 20 to be light sensitive. With such a structure (as shown in FIG. 3), charges can be injected into the channel layer at any desired location along the channel plate electrode 25.

As shown in FIG. 3, a bipolar injector 35 is positioned at one end of the channel plate electrode 25. An output electrode 40 is positioned at the other end of the channel plate electrode 25. The bipolar injector 35 comprises a p-type base layer 45. The base layer 45 has a p+ portion 46 and a p portion 47. The p+ portion 46 is doped to a concentration of, for example, $2 \times 10^{18}/cm^3$, and has a thickness of approximately 1,000 Å. The p portion is doped to a concentration of, for example, $5 \times 10^{16}/cm^3$, and has a thickness of approximately 2,500 Å. An N+ emitter region 50 is formed the base layer 45. As shown in FIG. 3, a portion of the p+ portion 47 is etched away to permit formation of the emitter region 50. An emitter contact 51 is formed on the emitter region 50. The emitter contact 51 forms an ohmic contact with the emitter region 50. A base contact 52 is formed on the base layer 45. The base contact 52 forms an ohmic contact with the base layer 45. The N type channel layer 20 comprises the collector of the bipolar injector 35.

As shown in FIG. 3, an R.F. transconductance amplifier 55 is connected to the emitter contact 51. The common base connection as shown in FIG. 3, has a lower input impedance than, for example, a common emitter connection. The current gain of the bipolar injector, however, is lower than in a common emitter connection. Since an ACT does not require a large current input, the lower current gain does not detract from the performance of the device. The R.F. transconductance amplifier 55 provides an output current corresponding to $g_m V_{in}$.

The ACT device 60 typically has an input impedance of approximately 50 kΩ with a common ohmic input contact. As shown in FIG. 3, the bipolar injector 35 comprises an NPN transistor having the ACT channel 20 as its collector. The input impedance of a bipolar injector 35 is approximately 2 KΩ. As explained below, the output impedance of the R.F. transconductance amplifier is approximately in the range of 80–150 KΩ at 1 MHz.

Figure 4:
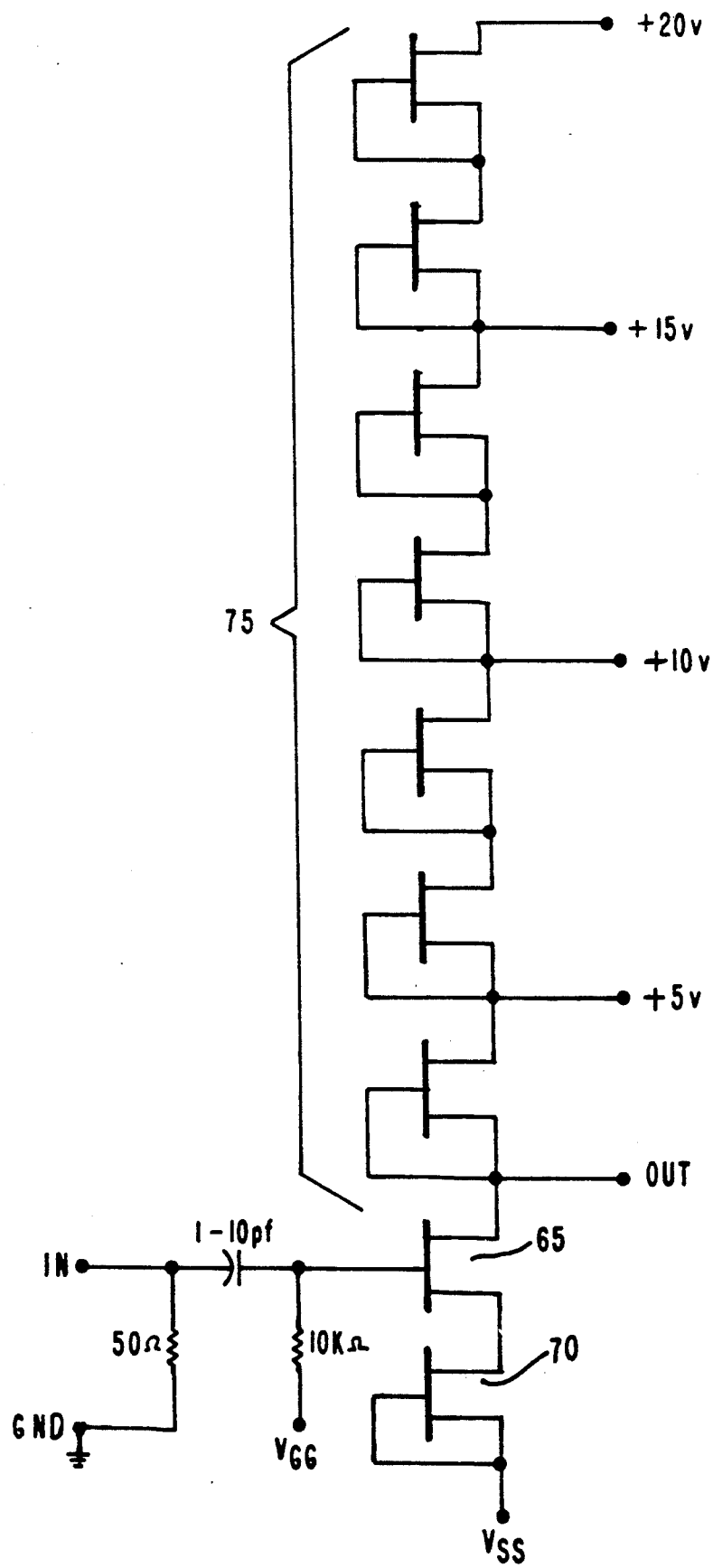
FIG. 4 is a schematic diagram of an R.F. transconductance amplifier shown in FIG. 3.

FIG. 4 is a schematic diagram of an embodiment of the R.F. transconductance amplifier 55. In FIG. 4, a gain FET 65 has its source connected to a source FET 70 that is connected as a resistor. Typically, the source FET 70 would have a resistance in the range of 7–15 KΩ. The drain of the gain FET 65 is connected to load FETs 75. The load FETs 75 provide a high A.C. impedance while still carrying the full D.C. bias for the gain FET 65. As with the source FET 70, each of the load FET 75 has A.C. resistance of approximately 7–15 KΩ. The output impedance of the transconductance amplifier 55 shown in FIG. 4 depends upon the number of load FETs 75 connected in series. As the number of load FETs 75 that are connected in series increases, the bias voltage must be increased correspondingly. Thus, as shown in FIG. 4, various bias voltages can be applied to the amplifier in accordance with the desired output impedance. If, for example, a bias voltage of +10 v is used, the FETs above this point are simply not used and do not affect the operation of the device.

Figure 5:
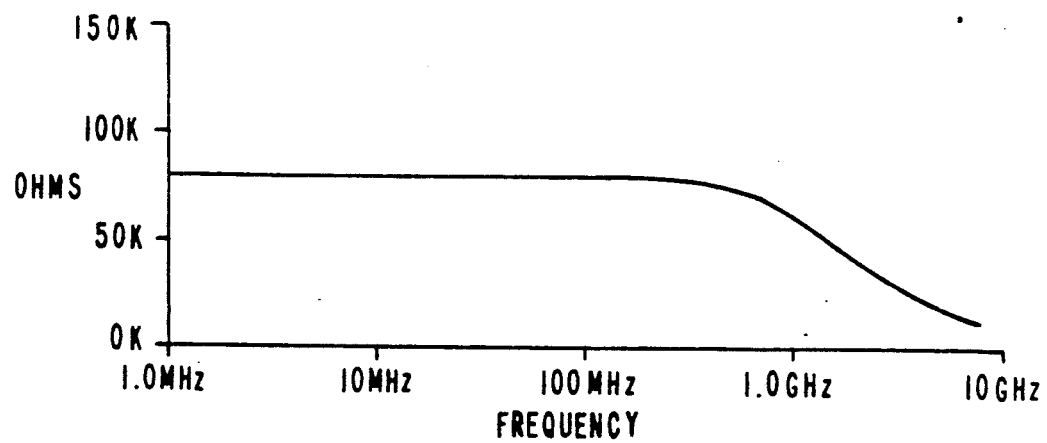
FIG. 5 is a graph illustrating the output impedance of the FIG. 4 R.F. transconductance amplifier.

FIG. 5 is a graph illustrating the output impedance of the FIG. 4 R.F. transconductance amplifier. As seen in FIG. 5, the R.F. transconductance amplifier of FIG. 4 has an output impedance in the range of 40–80 KΩ for frequencies up to approximately 100 MHz. Each of the FETs in FIG. 4 has, for example, a channel width of approximately 5–10 μm.

Figure 2:
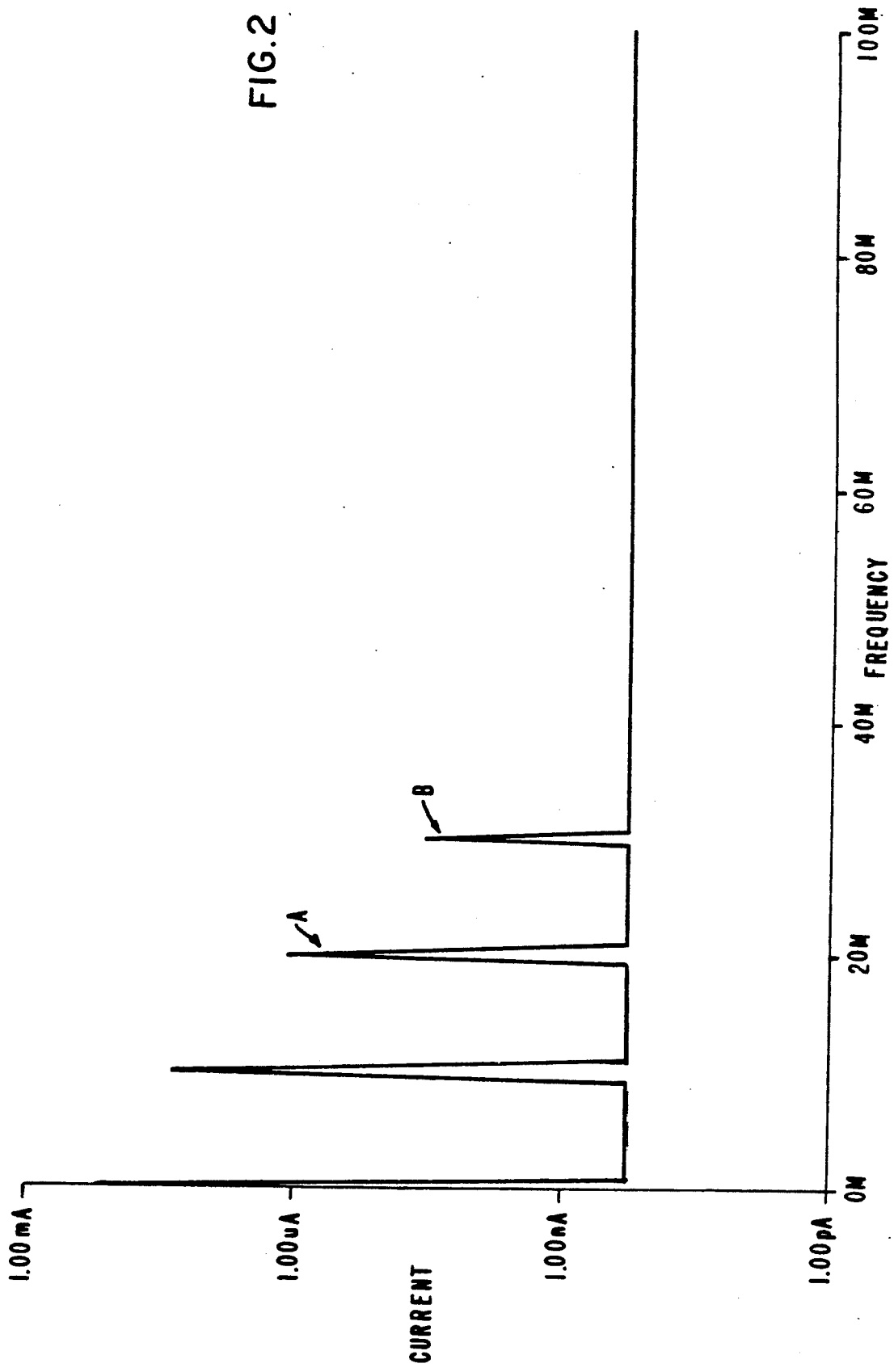
FIG. 2 is a graph showing the calculated frequency spectrum at the output of an ACT driven by a voltage source.

FIG. 6 is a graph showing the calculated frequency spectrum at the output of the linear ACT circuit of FIG. 3. As seen in FIG. 6, the second and third order harmonics are significantly reduced compared to these harmonics in FIG. 2. Thus, the FIG. 3 ACT circuit has a significantly improved, or linearized input characteristic that results in improved frequency response.

Figure 7:
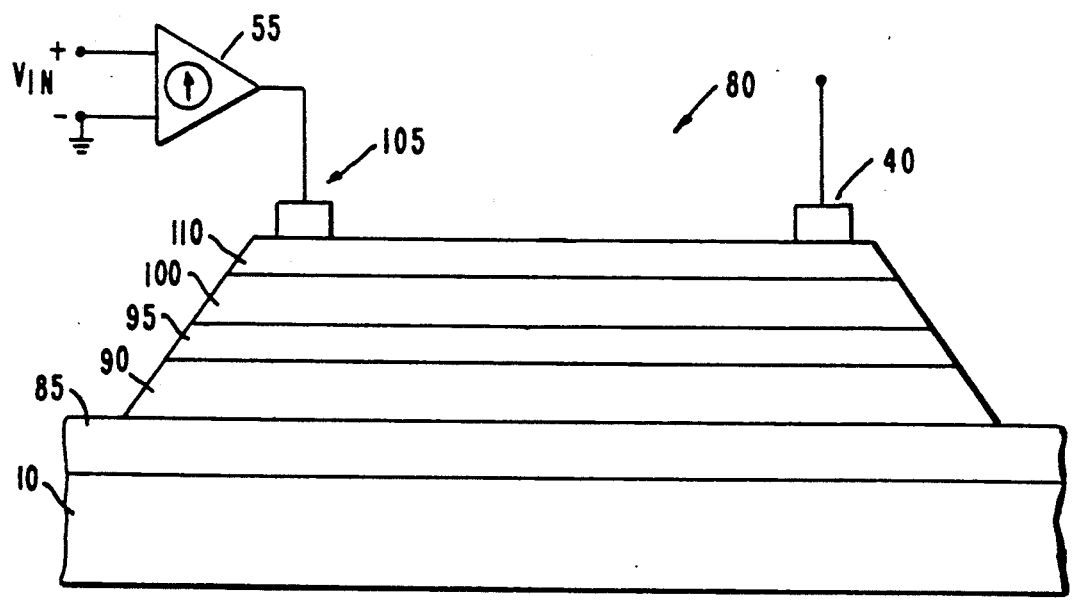
FIG. 7 is a cross-sectional view of a heterojunction ACT device usable in the linear ACT circuit of the present invention.

FIG. 7 is a cross-sectional view of a heterojunction ACT (HACT) device usable in the present invention. In comparing FIGS. 3 and 7, the ACT device of FIG. 3 is replaced by HACT 80. In the HACT device 80, a buffer layer 85 is formed on a GaAs substrate 10. A barrier layer 90 is formed on the buffer layer 85 together with a transport layer 95 and a barrier layer 100. The barrier layer 90 can have a thickness of approximately 1,000 Å; the transport layer 95 can have a thickness of approximately 400 Å and the barrier layer 100 can have a thickness of approximately 700 Å. Since the barrier layer 100 acts as a source of electrons to be transported in the transport layer 95, the barrier layer 100 comprises n-type AlGaAs that is doped to a concentration of, for example, $2 \times 10^{17}/cm^3$. The structure of an HACT is known to those skilled in the art and is described in, for example, Tanski et al., "Heterojunction acoustic transport devices on GaAs," Appl. Phys. Lett. Vol. 52, No. 1 pp. 18–20, Jan. 4, 1988; and Peterson et al., "Charge confinement in heterojunction acoustic charge transport devices," Appl. Phys. Lett. Vol. 55 No. 13 pp. 1330–1332 Sep. 25, 1989.

As shown in FIG. 7, the transconductance amplifier 55 is connected to an input electrode 105. The input electrode 105 can comprise a simple metal contact or the bipolar injector 35 shown in FIG. 3. A cap layer 110 is formed on the barrier layer 100. The cap layer 110 comprises undoped GaAs and has a thickness of about 200. As with the channel plate electrode 25 shown in FIG. 3, the channel plate electrode 110 can have various shapes depending upon the function of the device.

FIG. 8 is a graph showing the calculated frequency spectrum at the output of a heterojunction ACT driven by a voltage source. The data shown in FIG. 8 represents the response of a HACT device driven with a 10 MHz voltage source having a 50 μA DC output and a 10 μA AC output. As seen at points E and F of FIG. 8, the second and third order harmonics are quite large compared to the fundamental frequency. Thus, conventional HACT circuits have unwanted harmonics that adversely affect the system using a HACT device.

FIG. 9 is a graph showing the calculated frequency spectrum at the output of the linear heterojunction ACT circuit of FIG. 7. As seen in FIG. 9, the second and third order harmonics at points G and H are significantly reduced compared to these harmonics in FIG. 8. Thus, the FIG. 7 HACT circuit has a significantly improved, or linearized input characteristic that results in improved frequency response.

The foregoing is considered as illustrative only of the principles of the invention. Further, since numerous modifications and changes will readily occur to those skilled in the art, it is not desired to limit the invention to the exact construction and application shown and described, and accordingly, all suitable modifications and equivalents may be resorted to, falling within the scope of the invention and the appended claims and their equivalents.

We claim:

1. A linear acoustic charge transport (ACT) circuit comprising:
   an ACT device; and
   An R.F. transconductance amplifier for providing an input signal to said ACT device.

2. A linear acoustic charge transport circuit according to claim 1, wherein said ACT device comprises:
   a substrate;
   a channel layer having a first polarity and being formed over said substrate;
   a channel plate electrode having a second polarity that is opposite the first polarity and being formed over said channel layer;

an output electrode positioned on said channel layer at one end of said channel plate electrode;

a base layer having the second polarity and being positioned on said channel layer at another end of said channel plate electrode; and an emitter region having the first polarity and being formed in the base layer.

3. A linear acoustic charge transport circuit according to claim 1, wherein said R.F. transconductance amplifier comprises:

a gain transistor having an input and a source and a drain;

a source resistance operatively connected to the source of said gain transistor; and a plurality of load transistors connected in series with the drain of said gain transistor as a high A.C. load impedance.

4. A linear acoustic charge transport circuit according to claim 2, wherein said gain transistor, said source resistance and said plurality of load transistors each comprise FETs having a small width.

5. A linear acoustic charge transport circuit according to claim 1, wherein said ACT device comprises:

a semi-insulating GaAs substrate;

an AlGaAs barrier layer formed over said substrate;

a GaAs transport layer formed on said barrier layer;

an n - type AlGaAs barrier layer formed on said transport layer;

a cap layer formed on said n - type barrier layer;

an output electrode formed on said n - type barrier layer at one end of said cap layer; and an input electrode formed at another end of said cap layer and operatively connected to said R.F. transconductance amplifier.

6. A linear acoustic charge transport circuit according to claim 5, wherein said R.F. transconductance amplifier comprises:

a gain transistor having an input and a source and a drain;

a source resistance operatively connected to the source of said gain transistor; and a plurality of load transistors connected in series with the drain of said gain transistor as a high A.C. load impedance.

7. A linear acoustic charge transport circuit according to claim 6, wherein said gain transistor, said source resistance and said plurality of load transistors each comprise FETs having a small width.

* * * * *